United States Patent
Shirley

(10) Patent No.: US 10,741,501 B1
(45) Date of Patent: Aug. 11, 2020

(54) SYSTEMS AND METHODS FOR SHEATHING ELECTRONIC COMPONENTS

(71) Applicant: Keysight Technologies, Inc., Santa Rosa, CA (US)

(72) Inventor: Timothy Earl Shirley, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/166,323

(22) Filed: Oct. 22, 2018

(51) Int. Cl.
*H01L 23/552* (2006.01)
*H01L 23/538* (2006.01)
*H01L 23/498* (2006.01)
*H01L 25/065* (2006.01)
*H01L 21/311* (2006.01)
*H01L 21/027* (2006.01)
*H01L 21/288* (2006.01)
*H01L 21/321* (2006.01)
*H01L 21/48* (2006.01)

(52) U.S. Cl.
CPC ........ *H01L 23/552* (2013.01); *H01L 21/0274* (2013.01); *H01L 21/2885* (2013.01); *H01L 21/31144* (2013.01); *H01L 21/32115* (2013.01); *H01L 21/4846* (2013.01); *H01L 23/49811* (2013.01); *H01L 23/5386* (2013.01); *H01L 25/0655* (2013.01)

(58) Field of Classification Search
CPC .... H01L 23/552; H01L 23/36; H01L 23/4334
See application file for complete search history.

(56) References Cited

U.S. PATENT DOCUMENTS

| | | | |
|---|---|---|---|
| 5,639,989 A * | 6/1997 | Higgins, III | H01L 23/552 174/386 |
| 6,492,194 B1 | 12/2002 | Bureau | |
| 7,259,041 B2 | 8/2007 | Stelzl | |
| 7,445,968 B2 | 11/2008 | Harrison | |
| 9,620,463 B2 | 4/2017 | Kim et al. | |
| 2002/0129957 A1* | 9/2002 | Kolb | H01L 23/28 174/546 |
| 2005/0112796 A1* | 5/2005 | Ararao | H01L 21/4878 438/106 |

(Continued)

FOREIGN PATENT DOCUMENTS

CN 105702664 A 6/2016

*Primary Examiner* — George R Fourson, III

(57) ABSTRACT

Illustrative systems and methods disclosed herein pertain to a circuit assembly having components mounted upon a substratum element. The components are encased in a conductive sheath that may be made of metal. The conductive sheath, which is operative as a heat sink and/or an EMI shield, is structurally constructed to counteract deformation of the substratum element when the one or more components heat up during operation, or due to ambient temperature changes. In one exemplary embodiment, the conductive sheath has different thickness at different locations. An edge portion located at a transition between a first thickness and a second thickness of the conductive sheath undergoes deformation that prevents warping of the circuit assembly due to heat. In another exemplary embodiment, the conductive sheath has a gap provided between adjacent segments. The gap allows room for thermal expansion and counteracts deformation of the circuit assembly caused by heating.

13 Claims, 8 Drawing Sheets

(56) References Cited

U.S. PATENT DOCUMENTS

| | | | |
|---|---|---|---|
| 2006/0162157 A1* | 7/2006 | Schimetta | H01L 21/50 29/846 |
| 2007/0164409 A1* | 7/2007 | Holland | H01L 23/3107 257/678 |
| 2007/0200210 A1* | 8/2007 | Zhao | H01L 23/3128 257/676 |
| 2010/0148347 A1* | 6/2010 | Goh | H01L 23/04 257/690 |
| 2012/0217614 A1* | 8/2012 | Burgyan | H01L 23/057 257/531 |
| 2014/0036466 A1* | 2/2014 | Pahl | H01L 23/04 361/769 |
| 2015/0303149 A1* | 10/2015 | Zhai | H01L 23/3675 257/659 |
| 2016/0254236 A1 | 9/2016 | Kim et al. | |
| 2019/0043810 A1* | 2/2019 | Kapusta | H01L 23/3135 |
| 2019/0139902 A1* | 5/2019 | Lee | H01L 23/42 |

* cited by examiner

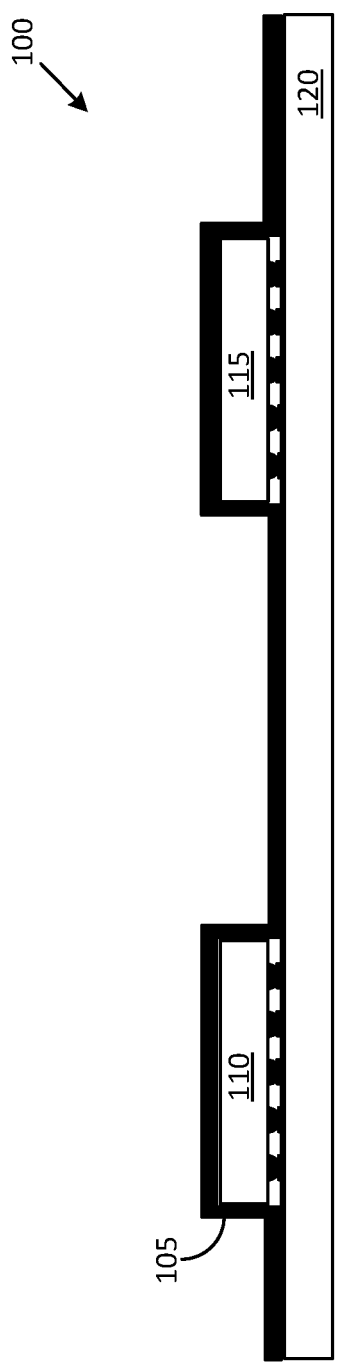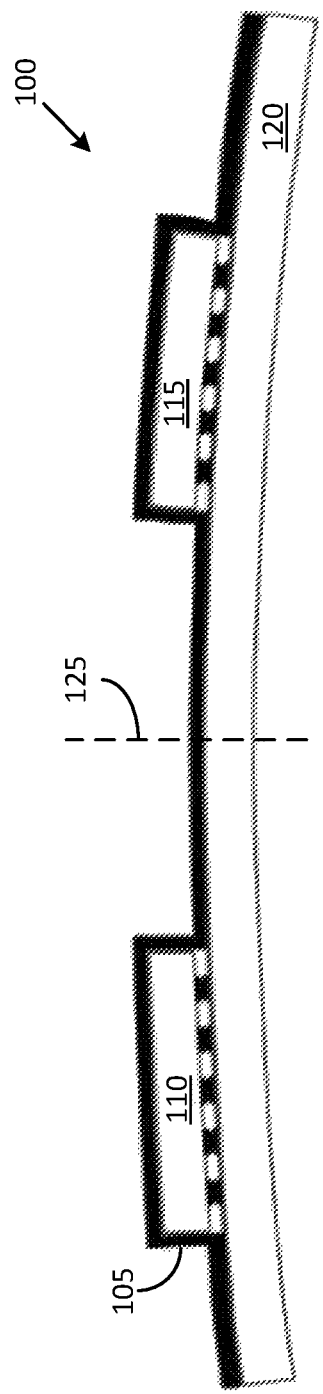

SYSTEMS AND METHODS FOR SHEATHING ELECTRONIC COMPONENTS

BACKGROUND

Electronic components such as power transistors and power supply modules are sometimes provided with a heat sink for dissipating heat generated by the electronic component when placed in operation. The heat sink is typically made of metal and a portion of the heat sink is attached to, or placed in contact with, an external surface of the electronic component for dissipating the heat generated by the electronic component. When the heat generating component is a relatively large component such as a power supply module, the heat sink may be attached to the component in a relatively straightforward manner such as by mounting the heat sink upon a top surface of the component. However, conventional techniques used for attaching a heat sink to a large component may not necessarily be effective when applied to electronic components and assemblies that are small in size.

For example, an electronic assembly that is known in the industry as a multi-chip module (MCM) may include several integrated circuits mounted upon a substrate in a flip-chip arrangement. Various discrete components such as surface mount resistors and surface mount capacitors, may be also mounted upon the substrate in the MCM. The discrete components are generally smaller in size (particularly in height) in comparison to the IC. One conventional approach to providing a heat sink upon an MCM involves using a metal cover that surrounds all the components in the MCM. The efficiency of such a heat sink may be sub-optimal due to a number of factors such as trapping of hot air inside the metal cover, insufficient contact with one or more ICs due to height differences between the ICs, and/or the use of low thermal conductivity thermal interface materials (TIM) at interfaces where gaps could develop due to expansion or contraction of materials having mismatched coefficients of thermal expansion (CTE).

In some applications, the metal cover may be used as an electro-magnetic interference (EMI) shield. However, such an EMI shield that surrounds all the components in the MCM may prove ineffective in some cases where one or more components located inside the metal cover may be exposed to EMI generated by one or more other components located inside the metal cover. It is therefore desirable to provide more effective shielding of components, particularly when the components are small in size and neighbored by various other components of different sizes.

SUMMARY

According to one exemplary embodiment of the disclosure, a circuit assembly includes a first flip-chip component mounted upon a top surface of a substratum element. The circuit assembly also includes a conductive sheath having a first section, a second section, and a third section. The first section of the conductive sheath comprises a conductive material deposited upon at least a part of a top surface of the first flip-chip component. The second section comprises the conductive material deposited upon at least one side surface of the first flip-chip component, the second section connected to the first section. The third section comprises the conductive material deposited upon at least a portion of the top surface of the substratum element. The third section is connected to the second section and includes an edge portion where the conductive material in the third section has a transition from a first thickness to a second thickness that is smaller than the first thickness. The edge portion is configured to undergo deformation to counteract warping of the circuit assembly due to heat generated in at least the first flip-chip component.

According to another exemplary embodiment of the disclosure, a circuit assembly includes a first component, a first section of a conductive sheath, and a second section of the conductive sheath. The first component has a first terminal attached to a first pad located upon a top surface of a substratum element. The first section of the conductive sheath comprises a conductive material deposited upon at least a part of a top surface of the first component and at least one side surface of the first component, the first section extending from the side surface of the first flip-chip component to a first location upon the top surface of the substratum element. The second section of the conductive sheath comprises the conductive material deposited upon at least a part of a top surface of the substratum element and extending to a second location upon the top surface of the substratum element, the second location located adjacent to, and isolated from, the first location by a gap that accommodates expansion of at least the first section of the conductive sheath due to heat generated in at least the first component.

According to another exemplary embodiment of the disclosure, a method includes providing a circuit assembly comprising a flip-chip component mounted upon a top surface of a substratum element; applying a plating base upon at least a portion of the circuit assembly, the portion of the circuit assembly including at least a part of a top surface of the flip-chip component; coating the plating base with a photoresist material; utilizing a developing procedure to selectively remove the photoresist material from one or more locations on the circuit assembly including at least the part of the top surface of the flip-chip component; and utilizing a plating bath to deposit a conductive material upon the one or more locations on the circuit assembly after selectively removing the photoresist material.

According to another exemplary embodiment of the disclosure, a method includes providing a circuit assembly comprising a flip-chip component mounted upon a top surface of a substratum element; applying a dielectric material upon at least a portion of the circuit assembly, the portion including a top surface of the flip-chip component; creating a patterned dielectric mask by removing one or more portions of the dielectric material, the one or more portions including dielectric material applied upon at least a part of the top surface of the flip-chip component; applying a plating base upon the patterned dielectric mask; and utilizing a plating bath to deposit a conductive material upon the plating base.

According to another exemplary embodiment of the disclosure, a method includes providing a circuit assembly comprising a flip-chip component mounted upon a top surface of a substratum element; applying a plating base upon at least a portion of the circuit assembly, the portion of the circuit assembly including at least a part of a top surface of the flip-chip component; utilizing a plating bath to deposit a conductive material upon the plating base; and at least one of removing a portion of the conductive material at one or more locations on the circuit assembly for reducing a thickness of the conductive material at the one or more locations on the circuit assembly, or removing an entirety of the conductive material at one or more other locations on the circuit assembly for providing one or more gaps in the conductive material at the one or more other locations on the circuit assembly.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

FIG. 1 shows an exemplary circuit assembly that has a conductive sheath provided upon two exemplary components.

FIG. 2 shows the exemplary circuit assembly having undergone deformation due to heat generated by the two exemplary components or due to ambient temperature changes.

DETAILED DESCRIPTION

Figure 3:
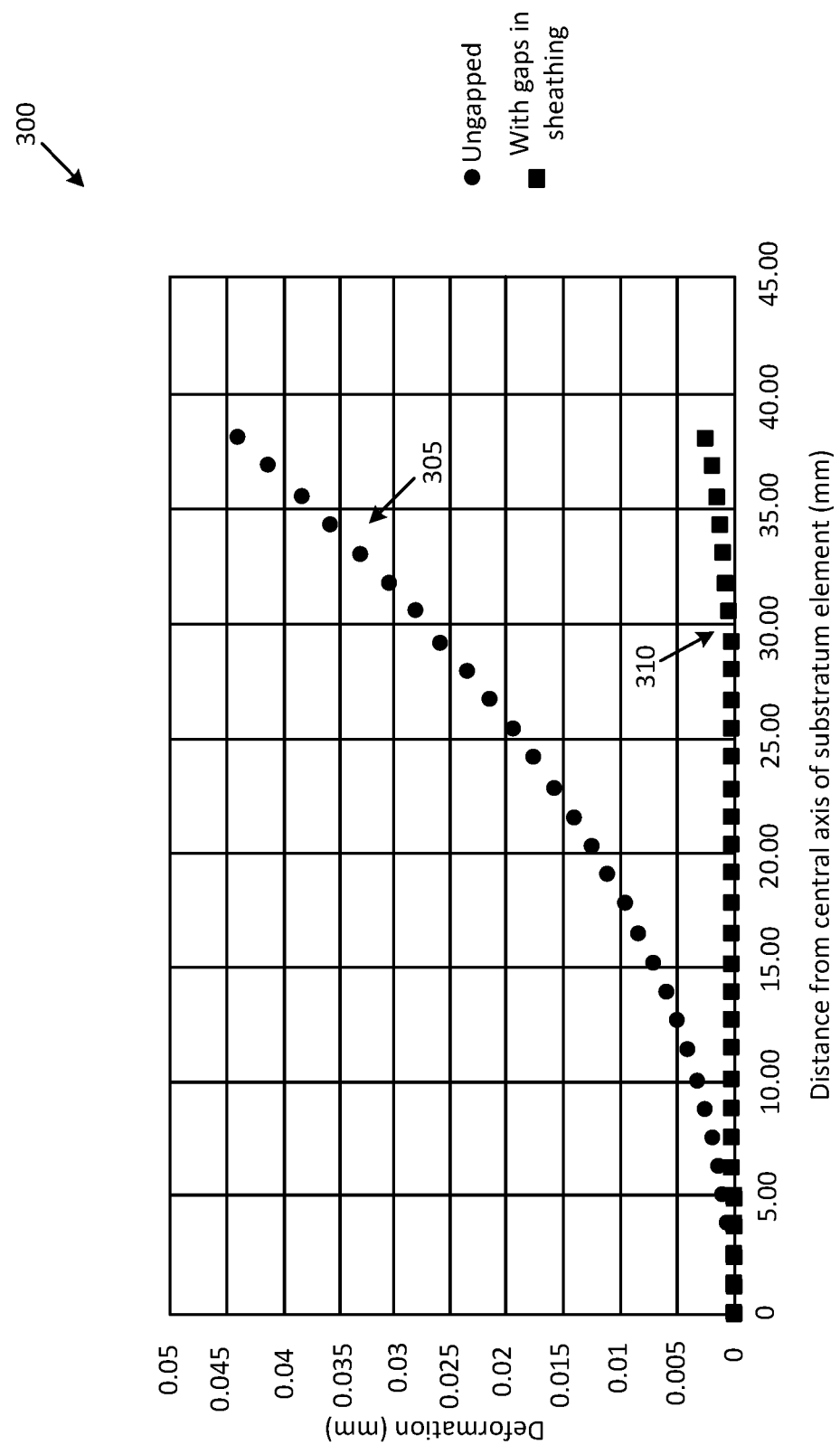
FIG. 3 shows an exemplary graphical representation of deformation characteristics associated with two different circuit assemblies when subjected to heating.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, various words such as "top," "bottom," and "side," which are used herein to indicate relative orientations and/or relative locations, should not necessarily be interpreted as absolute orientations and locations. For example, a "top" surface of an object that is shown upright in an exemplary illustration of the object can be located on the bottom when the object is inverted, or may be located on one side when the object is placed on its side. The words "conductive sheath" as used herein may be understood in various other ways such as a coating, a shield, a layer, or a covering. Furthermore, the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

In terms of a general overview, the various illustrative systems and methods disclosed herein pertain to a circuit assembly having one or more components mounted upon a substratum element such as a printed circuit board or a substrate. The one or more components are encased in a conductive sheath that may be made of metal or one or more other materials. The conductive sheath, which is operative as a heat sink in some applications, is structurally constructed to counteract deformation of the substratum element when the one or more components heat up during operation or when the ambient temperature changes. In one exemplary embodiment, the conductive sheath has different thickness at different locations. The various thicknesses provide different heat conduction capabilities and can also be used to provide strain relief for disrupting stress fields induced due to CTE mismatches. The strain relief counteracts deformation caused by heating. In another exemplary embodiment, the conductive sheath has gaps provided between adjacent segments. The gaps allow room for thermal expansion and counteract deformation caused by heating. In some applications the conductive sheath may also operate as an electromagnetic interference (EMI) shield.

FIG. 1 shows an exemplary circuit assembly 100 that has a conductive sheath 105 provided upon two exemplary components. The two exemplary components include a first component 110 and a second component 115 mounted upon a substratum element 120. The first component 110 can be any component such as, for example, an integrated circuit, a module (power supply module, transceiver module, optical module, etc.), an active component (transistor, detector diode, rectifying diode, light emitting diode, etc.), or a passive component (resistor, inductor, transformer, etc.). The second component 115 may be similar to the first component 110 or may be different. One or both of the first component 110 and the second component 115 may generate heat when the circuit assembly 100 is powered up and placed in operation.

The substratum element 120 can be any of several types of elements upon which the first component 110, the second component 115, and other components (not shown) are mounted. In one exemplary implementation, the substratum element 120 is a printed circuit board (PCB), and each of the first component 110 and the second component 115 is a surface mount component. The PCB includes metal tracks (not shown) on a top surface, a bottom surface, and in one or more intermediate layers (when the PCB is a multi-layer PCB) that provide interconnectivity between the various terminals of the first component 110 and the second component 115 and other components mounted upon the PCB. In another exemplary implementation, the substratum element 120 is a substrate of an integrated circuit (IC) or a substrate of a multi-chip module (MCM). The substrate can include multiple layers of materials. In yet another exemplary implementation, the substratum element 120 is a part of a wafer supporting multiple circuit assemblies. The wafer may be provided as a part of a batch manufacture procedure that includes singulating the wafer in order to produce parts that are substantially identical to each other (a batch of circuit assemblies, for example).

The conductive sheath 105 is a layer of a conductive material that is deposited upon one or more surfaces of the first component 110, one or more surfaces of the second component 115, and at least an upper surface of the substratum element 120. The conductive material can be a metal, a metal alloy, a thermally conductive material, or a mixture of various materials, selected to configure the conductive sheath 105 to operate as a heat sink and/or an EMI shield. In this exemplary implementation, the conductive sheath 105 has a uniform thickness and extends edge-to-edge on the top surface of the circuit assembly 100. When the circuit assembly 100 is in operation, the conductive sheath 105 conducts heat from the external surfaces of the first component 110 and the second component 115 and radiates the conducted heat into the air above the circuit assembly 100 and into the substratum element 120.

FIG. 2 shows the circuit assembly 100 having undergone deformation due to ambient temperature changes and/or heat generated by various components such as the first component 110 and the second component 115. The deformation can occur due to various factors such as an incompatibly between a coefficient of thermal expansion of the conductive sheath 105 and a coefficient of thermal expansion of a body portion of the first component 110, a body portion of the second component 115, and/or the substratum element 120 upon which the conductive sheath 105 is provided. For example, the conductive sheath 105 may be copper sheathing having a high coefficient of thermal expansion (such as ~16 ppm/C) whereas a body portion of the first component 110, a body portion of the second component 115, and/or the substratum element 120 may be silicon having a lower coefficient of thermal expansion (such as ~2.6 ppm/C). In this situation, the amount of expansion undergone by the copper sheathing is greater than that of the body portion of the first component 110, the body portion of the second component 115, and/or the substratum element 120, leading to a deformation of the substratum element 120. In the exemplary circuit assembly 100 shown in FIG. 2, the deformation has a bow-shaped curvature centered at a central axis 125. The deformation, which can have other shapes in other implementations, can be prevented or minimized by using various techniques.

In one exemplary technique, the conductive sheath 105 is provided room to expand laterally along a horizontal axis. The lateral expansion allows the conductive sheath 105 to remain in contact with the external surfaces of components such as the first component 110, and the second component 115, as well as the substratum element 120, and simultaneously provide strain relief, thereby minimizing or eliminating deformation of the substratum element 120. In some cases where the longitudinal dimension of the conductive sheath 105 is relatively small, such as when the conductive sheath 105 is used to sheath a single component or two components located close to each other, the room to expand may be automatically provided at one or more edges of the conductive sheath 105. However, when the longitudinal dimension of the conductive sheath 105 is relatively large, such as, when the conductive sheath 105 is provided over a batch of circuit assemblies fabricated upon a wafer, other techniques may be employed for providing strain relief. In one exemplary technique, one or more gaps are provided at various places in the conductive sheath 105 located inside the periphery of the wafer.

FIG. 3 shows an exemplary graphical representation 300 of deformation characteristics associated with two different circuit assemblies when subjected to heating. The circular dots correspond to a first graph 305 that is indicative of a deformation characteristic experienced by a first circuit assembly having a substratum element in the form of a wafer and a conductive sheath that extends from a central axis (such as the central axis 125 shown in FIG. 2) to a periphery of the wafer. In one exemplary embodiment of a circuit assembly associated with the first graph 305, the wafer has a circular shape and the conductive sheath covers the circular shape with no gaps provided inside the circular periphery. The coordinates (0,0) of the graphical representation 300 is indicative of the central axis of the wafer, the x-axis represents distance from the central axis of the wafer, and the y-axis represents an extent of a deformation of the wafer. First graph 305 indicates a significant amount of deformation at locations further from the central axis of the wafer. For example, at about a 38 mm distance from the central axis of the wafer, the deformation is about 0.045 mm.

The square dots correspond to a second graph 310 that is indicative of a deformation characteristic experienced by a second circuit assembly having a substratum element in the form of a wafer and a conductive sheath that extends from a central axis (such as the central axis 125 shown in FIG. 2) to a periphery of the wafer. In one exemplary embodiment of a circuit assembly associated with the second graph 310, the wafer has a circular shape and the conductive sheath covers the circular shape with several gaps provided inside the circular periphery. Second graph 310 indicates a significant reduction in deformation at locations further from the central axis of the wafer in comparison to first graph 305. For example, at about 38 mm from the central axis of the wafer the deformation is about 0.0025 mm (in comparison to the 0.045 mm deformation associated with the first graph 305).

Figure 4:
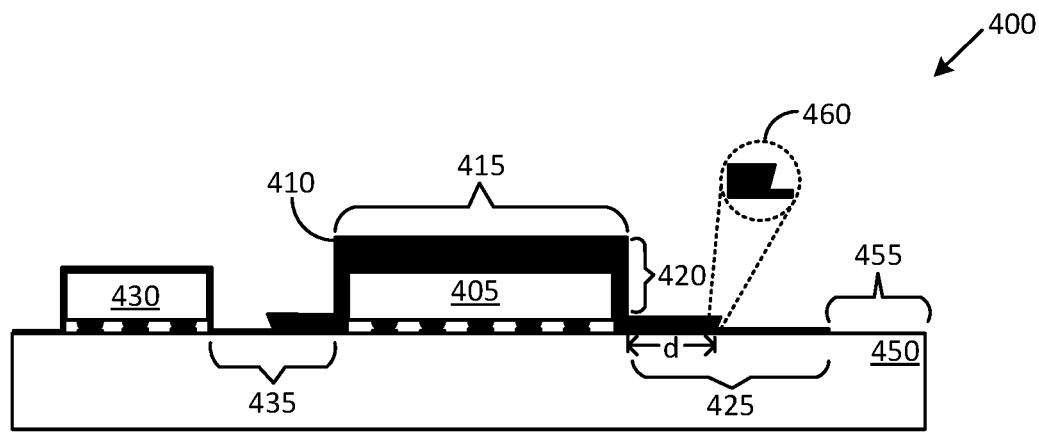
FIG. 4 shows an exemplary circuit assembly that has a conductive sheath provided upon two exemplary components in accordance with a first embodiment of the disclosure.

FIG. 4 shows a circuit assembly 400 that has a conductive sheath 410 provided upon exemplary components in accordance with a first exemplary embodiment of the disclosure. The exemplary components include a first component 405 and a second component 430 mounted upon a substratum element 450, which is a PCB in this exemplary embodiment. In this exemplary embodiment, each of the first component 405 and the second component 430 is a flip-chip integrated circuit that is mounted upon the substratum element 450 using flip-chip mounting procedures. In other embodiments, the first component 405 and/or the second component 430 may be packaged in other ways and mounted upon the substratum element 450 using other mounting procedures such as a through-hole component mounting procedure or a surface mount package mounting procedure.

The first component 405 is one of various types of components such as an integrated circuit, a semiconductor die, a microelectronic package, a module (power supply module, transceiver module, optical module, etc.), an active component (transistor, detector diode, rectifying diode, light emitting diode, etc.), or a passive component (resistor, inductor, transformer, etc.). The second component 430 may be identical, similar, or different than the first component 405. In one exemplary implementation, the second component 430 is a component such as an RF amplifier that is susceptible to radio-frequency interference and/or a component such as a switching power supply that emits an undesirable amount of electro-magnetic radiation.

When in operation, the first component 405 generates an amount of heat that may compromise the integrity of the first component 405 and/or the performance of the first component 405. It is therefore desirable that the heat generated by the first component 405 be dissipated by the use of a heat sink so as to protect the first component 405 from overheating and/or to obtain a desired level of operational efficiency. A major part of the heat generated by the first component 405 is emitted from a top surface of the first component 405 and a smaller amount of heat is emitted from the side surfaces of the first component 405. The heat generated by the first component 405 is dissipated by a portion of the conductive sheath 410 that completely covers the first component 405. In this exemplary embodiment, a first section 415 of the conductive sheath 410 that is deposited upon the top surface of the first component 405 has a first thickness that is greater than a thickness of a second section 420 that is provided on one or more side surfaces of the first component 405. A "side" surface as referred to in this disclosure, can be a planar surface (such as the vertical sides of an IC) or a non-planar surface (such as the vertical side of a power transistor in a circular can package).

Heat is transferred from the top surface of the first component 405 into the first section 415 of the conductive sheath 410 when the first component 405 is in operation. A portion of the heat in the first section 415 is transferred into the second section 420 of the conductive sheath 410, which operates as a heat sink to the side surface(s) of the first component 405. A portion of the heat in the second section 420 of the conductive sheath 410 is transferred into a third section 425 of the conductive sheath 410. The heat transferred into the third section 425 is dissipated into the air above the third section 425 as well as into the substratum element 450 below the third section 425.

Heat transferred into the conductive sheath 410 from various components such as the first component 405 and the second component 430 can cause the conductive sheath 410 to deform at various locations. The conductive sheath 410 may also deform due to heat received from other sources, such as from ambient air around the circuit assembly 400. Deformation of the conductive sheath 410 can lead to warping of the circuit assembly 400 if no strain relief is provided to counteract the deformation.

In one exemplary implementation, strain relief is provided by configuring the conductive material to have different thicknesses at one or more sections of the conductive sheath 410. In this exemplary embodiment, conductive material in the third section 425 includes a transition from a first thickness to a second thickness that is smaller than the first thickness at an edge portion 460 located at a distance "d" from the first component 405. The edge portion 460 is configured to undergo deformation (as shown) to counteract warping of the circuit assembly 400 due to heat. The distance "d" can be selected in accordance with various parameters, such as a quantity of heat generated by the first component 405 when placed in operation. The edge portion 460 can have different shapes such as a single step shape, a multi-step shape, and/or a sloping shape. In the exemplary implementation shown in FIG. 4, the edge portion 460 has a single step shape. An upper portion of the single step undergoes a lateral displacement in a direction that is parallel to the top surface of the substratum element 450, when heat is transferred into the conductive sheath 410 from the first component 405 and/or ambient air. This expansion reduces stress and counteracts deformation of the circuit assembly 400.

A fourth section 435 of the conductive sheath 410 may be optionally provided upon all, or a portion, of the top surface of the substratum element 450. In this exemplary embodiment, the conductive material in the fourth section 435 also transitions from a first thickness to a second thickness that is smaller than the first thickness. The third section 425 and the fourth section 435 may be parts of a ground plane that is provided upon the top surface of the substratum element 450. A portion 455 on the top surface of the substratum element 450 is left exposed and does not include the conductive sheath 410.

As indicated above, the second component 430 is a component that is susceptible to radio-frequency interference and/or emits an undesirable amount of electro-magnetic radiation. The portion of the conductive sheath 410 that is provided upon the second component 430 can be configured as an EMI shield by placing the conductive sheath 410 at ground potential. For example, the third section 425 is placed at ground potential by connecting the third section 425 to a ground node or to a power supply node. The power supply node is operative as an AC ground node. When the third section 425 is placed at ground potential, the fourth section 435 that is connected to the third section 425 is automatically placed at ground potential as well. Alternatively, the fourth section 435 is placed at ground potential by connecting the fourth section 435 to the ground node or to the power supply node. The conductive sheath 410 can thus be used as a multipurpose element (heat sink and/or EMI shield) in accordance with various applications. In some applications, the conductive sheath 410 may be omitted from deposition upon one or more components that do not require a heat sink and/or an EMI shield.

Figure 5:
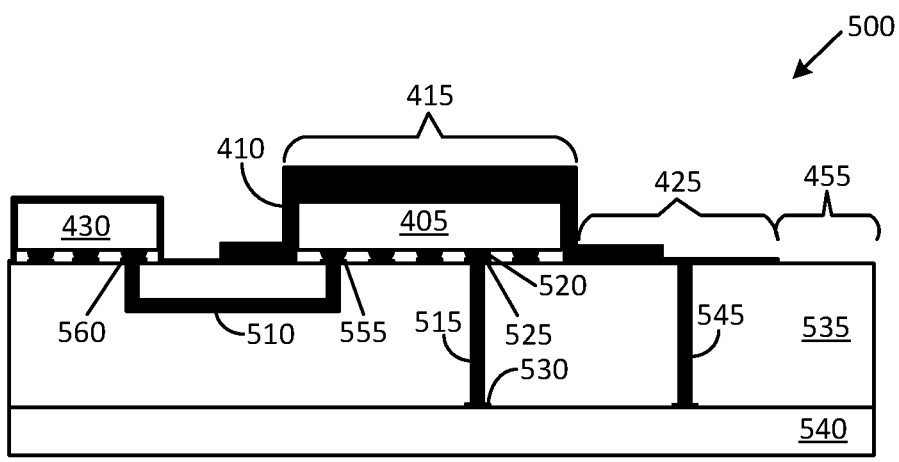
FIG. 5 shows an exemplary circuit assembly that has a conductive sheath provided upon two exemplary components in accordance with a second embodiment of the disclosure.

FIG. 5 shows a circuit assembly 500 that has a conductive sheath 410 provided upon two exemplary components in accordance with a second exemplary embodiment of the disclosure. The two exemplary components include the first component 405 and the second component 430 described above. In this second exemplary embodiment, the first component 405 and the second component 430 are mounted upon a substratum element 450 that includes a substrate 540 and an interposer 535. The interposer 535, which can include one or more dielectric layers, is fabricated upon a top surface of the substrate 540. Several pads may be provided upon a top surface of the interposer 535. Some or all of these pads can be solder pads for soldering various elements (such as terminals of a flip-chip IC) for providing interconnectivity between components and/or interconnectivity between layers (through-hole vias, for example), and/or for other purposes (test pads, for example).

In this exemplary second embodiment, a first metal conductor 545 extends through the interposer 535 from a location on the top surface of the interposer 535 upon which the third section 425 of the conductive sheath 410 (shown in FIG. 4) is fabricated, to a bottom surface of the interposer 535. The bottom surface of the interposer 535 is at ground potential when a top surface of the substrate 540 includes a pad (or a metal plane) that is connected to ground. This configuration can be used to place the third section 425 of the conductive sheath 410 at ground potential.

In this exemplary second embodiment, a second metal conductor 515 extends from a pad 525 located upon the top surface of the interposer 535 and through the interposer 535 to a pad 530 located upon a top surface of the substrate 540. A first terminal 520 of the first component 405 is attached to the pad 525 (a solder pad, in this example). The pad 530 located upon the top surface of the substrate 540 may be connected to various other entities such as another pad located upon the top surface of the substrate 540 or a metal plane connected to ground.

The exemplary second embodiment also includes a third metal conductor 510 that extends from a pad 555 located upon the top surface of the interposer 535 to a pad 560 that is also located upon the top surface of the interposer 535. A terminal of the second component 430 is attached to the pad 560 (a solder pad, in this example). The third metal conductor 510 can be provided in the form of a metal track embedded inside the interposer 535, for example, in a layer provided for such interconnections.

Figure 6:
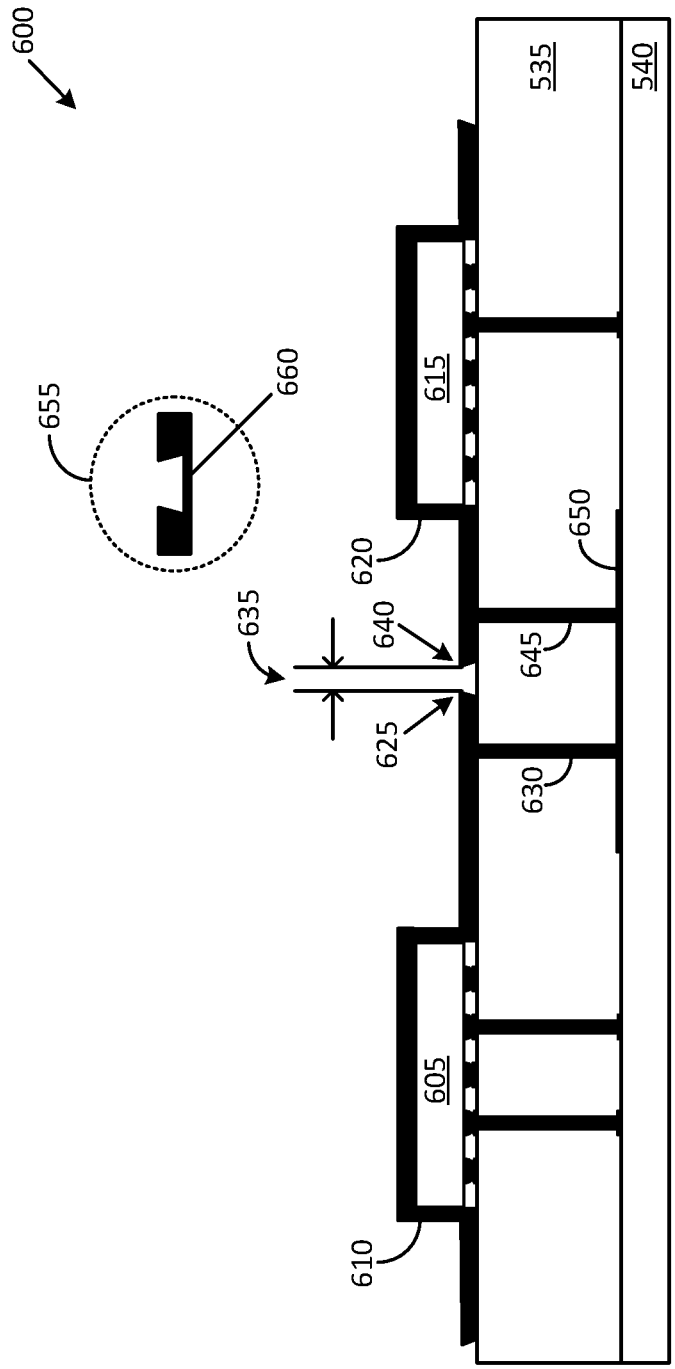
FIG. 6 shows an exemplary circuit assembly that has a conductive sheath provided upon two exemplary components in accordance with a third embodiment of the disclosure.

FIG. 6 shows a circuit assembly 600 that has a first section 610 of a conductive sheath provided upon a first component 605 and a second section 620 of the conductive sheath provided upon a second component 615 in accordance with a third exemplary embodiment of the disclosure. In this third exemplary embodiment, each of the first section 610 and the second section 620 has a uniform thickness. In another exemplary embodiment, the first section 610 and/or the second section 620 has different thicknesses at different surfaces (top surface, side surface etc.) of the first component 605 and the second component 615 respectively.

The first section 610 includes conductive material deposited upon at least a portion of a top surface of the first component 605 and upon one or more side surfaces of the first component 605. The conductive material deposited upon the side surfaces of the first component 605 extends to a first location 625 upon the top surface of the interposer 535.

The second section 620 includes conductive material deposited upon at least a portion of a top surface of the second component 615 and upon one or more side surfaces of the second component 615. The conductive material deposited upon the side surfaces of the second component 615 extends to a second location 640 upon the top surface of the interposer 535. The second location 640 is separated from the first location 625 by a gap 635 in which no conductive material is present. The gap 635 is selected to accommodate a deformation in one or both of the first section 610 and the second section 620. The deformation can occur when heat is generated in one or both of the first component 605 and the second component 615 or due to ambient temperature changes. An expanded view 655 illustrates deformation in an edge portion of the first section 610 as well as in an edge portion of the second section 620 due to heat generated in the first component 605, the second component 615, and/or due to ambient temperature changes. The gap 635 accommodates expansion of the two edges and prevents warping of the conductive sheath and/or the circuit assembly 600.

The first section 610 is interconnected to the second section 620 by a first metal conductor 630 that extends from the first section 610 on the top surface of the interposer 535 to a conductive layer 650 on the top surface of the substrate 540. A second metal conductor 645 extends from the second section 620 on the top surface of the interposer 535 to the conductive layer 650, which provides interconnectivity between the first metal conductor 630 and the second metal conductor 645.

In an alternative implementation, a layer 660 of the conductive material is provided in the gap 635. The layer 660 bridges the first section 610 to the second section 620 and has a smaller thickness than the thickness of the conductive material in the first section 610 and/or the second section 620. Layer 660 provides interconnectivity and/or EMI shielding between the first section 610 and the second section 620.

Figure 7:
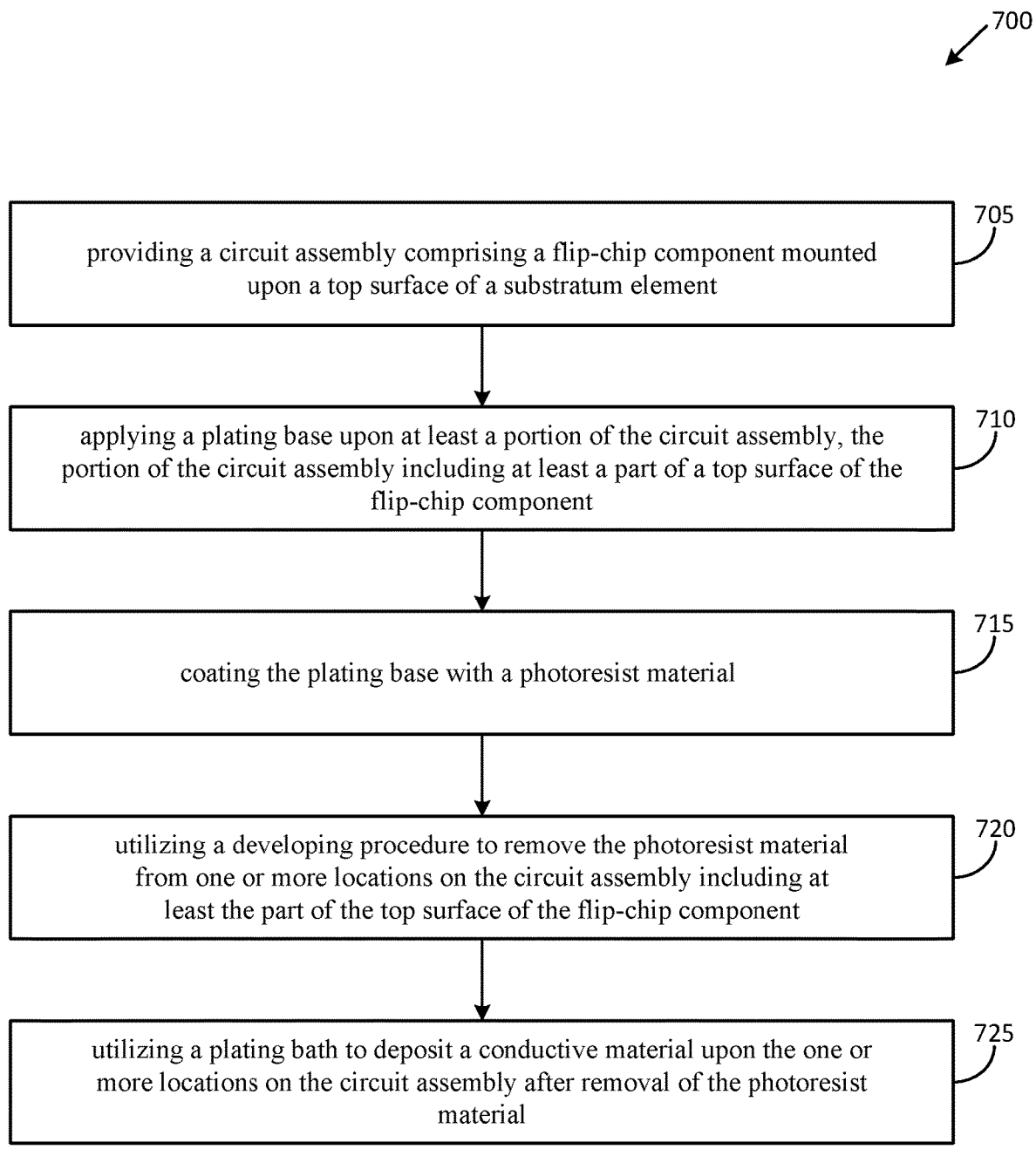
FIG. 7 shows a flowchart that illustrates a first exemplary method to fabricate a circuit assembly in accordance with an embodiment of the disclosure

FIG. 7 shows a flowchart 700 that illustrates a first exemplary method to fabricate a circuit assembly in accordance with an embodiment of the disclosure. Block 705 pertains to providing a circuit assembly comprising a flip-chip component mounted upon a top surface of a substratum element. A few examples of such a circuit assembly include the circuit assembly 400, the circuit assembly 500, and the circuit assembly 600 described above. The circuit assembly 500 is used below as a non-limiting example to describe the operations that follow the operation described in block 705.

Prior to proceeding with the operation indicated in block 710, any gaps between a bottom surface of each of the flip-chip components and a top surface of the substratum element is underfilled and sealed by using one or more procedures such as a chemical vapor deposition (CVD) procedure, capillary underfill process (CUF), or a no-flow underfill process and a suitable sealant material.

Block 710 pertains to applying a plating base upon at least a portion of the circuit assembly, the portion of the circuit assembly including at least a part of a top surface of the flip-chip component. For example, with respect to the circuit assembly 500, a plating base is applied upon the top surface of the first component 405, the top surface of the second component 430, and the exposed top surface of the interposer 535. Application of the plating base can be carried out using various deposition procedures such as a CVD procedure, an evaporation procedure, or a sputtering procedure. In one exemplary implementation, the plating base is applied in the form of multiple layers such as a first layer of a material having an adhesive property, a second layer of a material having a barrier property, and a third layer of a material having a seed property. One example of a material having an adhesive property is titanium. Examples of materials having a barrier property include tantalum and platinum. One example of a material having a seed property is copper.

Block 715 pertains to coating the plating base with a photoresist material. Upon completion of this operation, a two-layer structure (photoresist material on top of the plating base) covers all exposed surfaces of the circuit assembly 500 including the top surface of the first component 405, the top surface of the second component 430, and the portion 455 that is exposed on the top surface of the interposer 535.

Block 720 pertains to utilizing a developing procedure (such as a photolithographic procedure) to remove the photoresist material from one or more locations on the circuit assembly including at least the part of the top surface of the flip-chip component. In one exemplary developing procedure, a mask is used for selectively removing the photoresist material from various locations upon the circuit assembly 500, such as the top surface of the first component 405 and a part of the top surface of the interposer 535. The mask includes portions configured to prevent removal of the photoresist material applied to the to the top surface of the second component 430, and to select portions on the top surface of the interposer 535 such as portion 455. The locations from which the photoresist material has been removed (using photoresist development or an etching procedure, for example) now become locations in which the plating base has been selectively exposed.

Block 725 pertains to utilizing a plating bath to deposit a conductive material upon the one or more locations on the circuit assembly after selectively removing the photoresist material. In one exemplary implementation, the plating bath is used for carrying out an electroplating procedure for depositing the conductive material upon the plating base that has been exposed on the circuit assembly 500 after the developing procedure. In an exemplary implementation, the quantity of conductive material deposited upon the plating base can be controlled by using various techniques such as plating chemistry, plating current, and plating time, thereby creating regions of a first thickness (plating plus plating base) and regions of a second thickness (plating base only). The two thicknesses and their placement can be selected to counteract and/or prevent deformation in the circuit assembly 500 due to heating.

In an alternative exemplary implementation, the quantity of conductive material deposited upon the plating base can also be controlled by alternating between a plating procedure in which a first plating step is carried out, followed by a photoresist removal step in which photoresist is removed from selected areas, followed by a second plating step, and so on. Such a plating procedure can be used to provide conductive material having a first thickness upon the top surface of the first component 405 (first section 415), a second thickness upon the top surface of the second component 430, and a third thickness upon the top surface of the interposer 535. The various thicknesses can be selected to counteract and/or prevent deformation in the circuit assembly 500 due to heating.

The photoresist remaining on the circuit assembly 500 after the conductive material has been deposited can be optionally removed. The plating base that is exposed after the remaining photoresist has been removed can be either removed selectively or in its entirety if so desired or can be left in place so as to operate as a global shield upon the circuit assembly 500.

Figure 8:
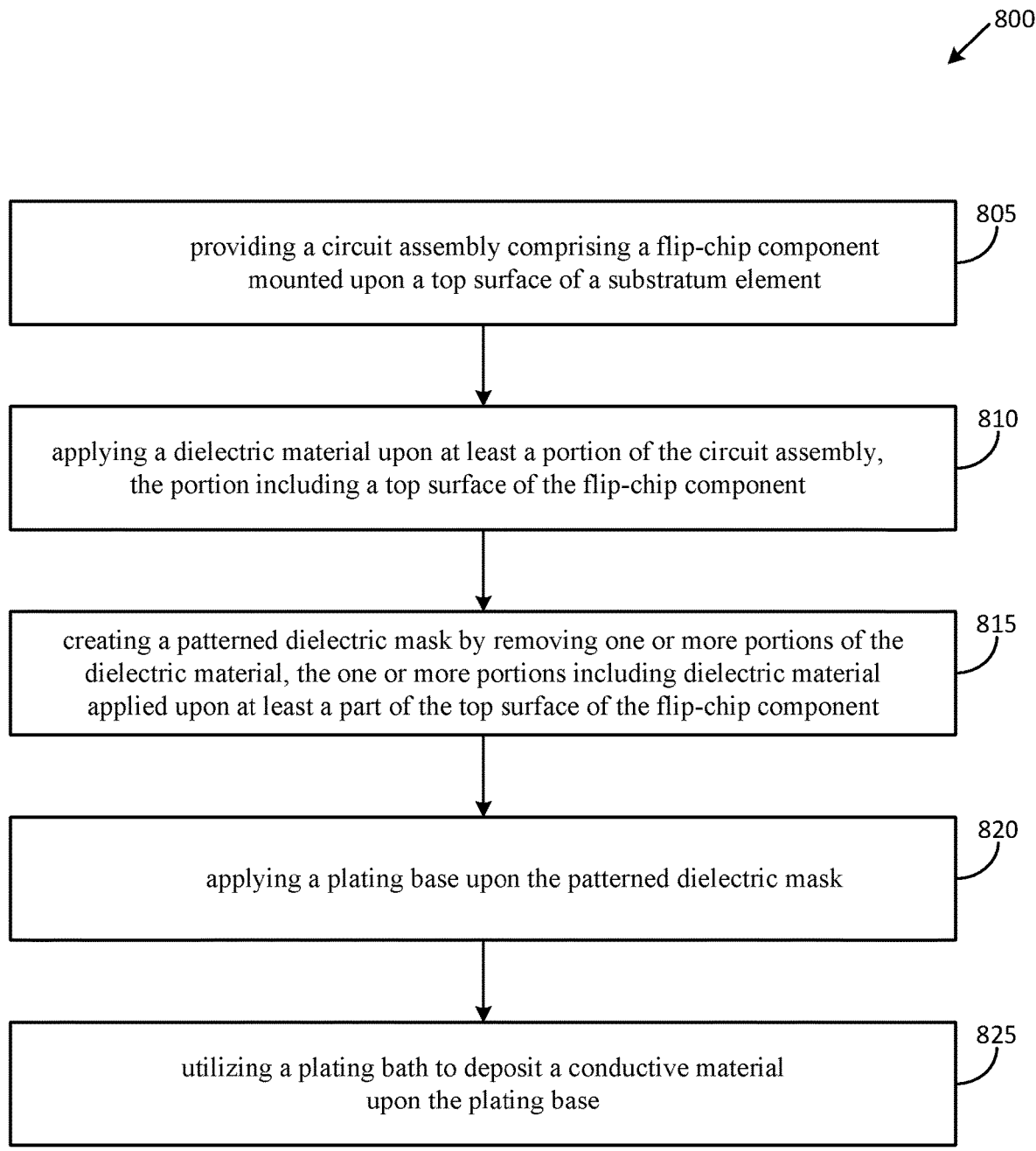
FIG. 8 shows a flowchart that illustrates a second exemplary method to fabricate a circuit assembly in accordance with an embodiment of the disclosure.
Figure 9:
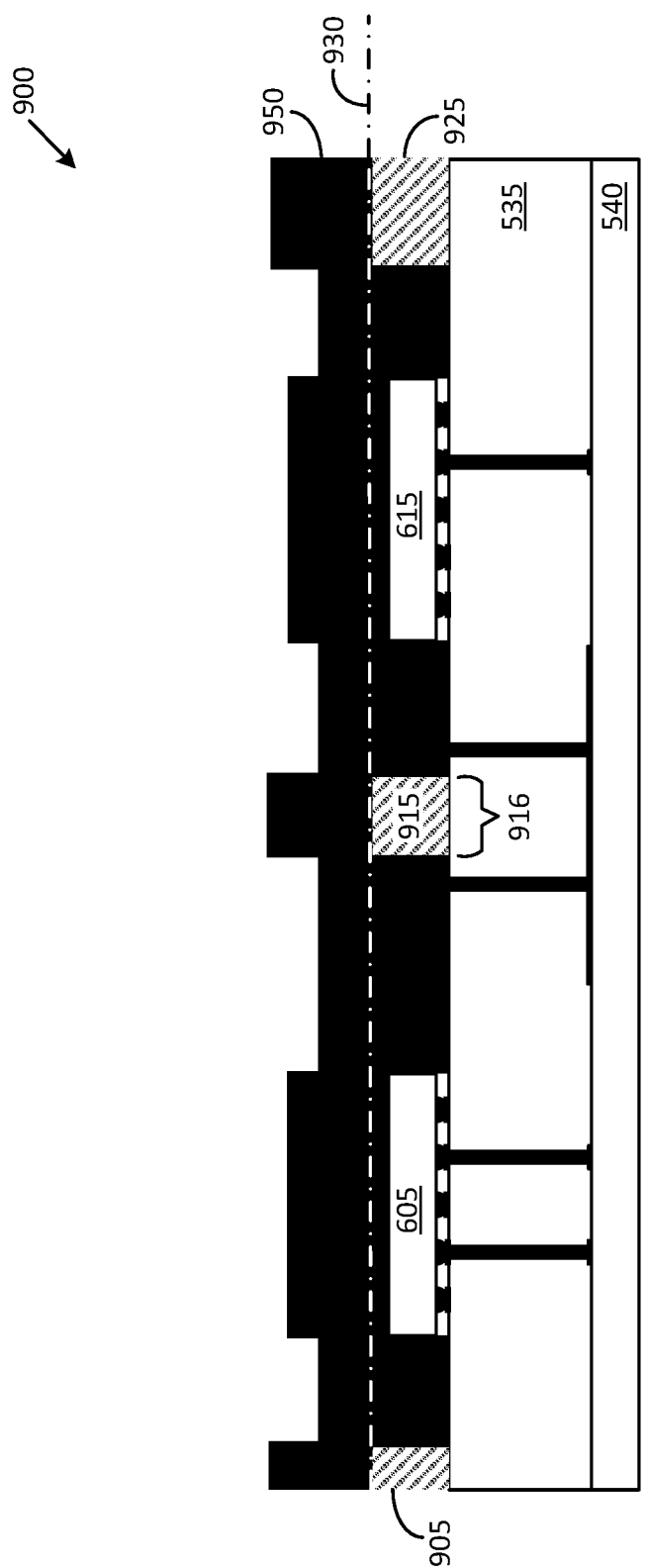
FIG. 9 illustrates an exemplary circuit assembly during a stage of fabrication in accordance with the method illustrated in FIG. 8.

FIG. 8 shows a flowchart 800 that illustrates a second exemplary method to fabricate a circuit assembly in accordance with an embodiment of the disclosure. Block 805 pertains to providing a circuit assembly comprising a flip-chip component mounted upon a top surface of a substratum element. One example among many of such a circuit assembly is the circuit assembly 900 that is shown in FIG. 9. The circuit assembly 900 is used below as a non-limiting example to describe the operations following the operation described in block 805.

Prior to proceeding with the operation indicated in block 810, any gaps between a bottom surface of each of the flip-chip components and a top surface of the substratum element is underfilled and sealed by using one or more procedures such as a chemical vapor deposition (CVD) procedure, capillary underfill process (CUF), or a no-flow underfill process and a suitable sealant material.

Block 810 pertains to applying a dielectric material upon all or at least a portion of the circuit assembly, the portion of the circuit assembly including at least a part of a top surface of the flip-chip component. In one exemplary implementation, the dielectric material is applied upon the entire top portion of the circuit assembly 900 that is shown in FIG. 9. The dielectric material now covers the entire top surface of the first component 605, the top surface of the second component 615, and the entire top surface of the interposer 535. In another exemplary implementation, the dielectric material is applied upon only a portion of the circuit assembly 900. The dielectric material can be any of various materials such as benzocyclobutene (BCB), polyimides, photoresists, epoxies, and SU-8.

Block 815 pertains to creating a patterned dielectric mask by removing one or more portions of the dielectric material, the one or more portions including dielectric material applied upon at least a part of the top surface of the flip-chip component. The patterned dielectric mask is created by first defining one or more areas in which the dielectric material has to be removed, followed by an etching procedure to remove the dielectric material from these areas.

In an exemplary implementation where the dielectric material has been applied upon the entire top portion of the circuit assembly 900, a patterned dielectric mask is created by defining a first area that surrounds and includes the first component 605 and a second area that surrounds and includes the second component 615, followed by an etching procedure to remove the dielectric material from the first area and the second area.

Block 820 pertains to applying a plating base upon the patterned dielectric mask. In one exemplary implementation, the plating base covers the patterned dielectric mask including the areas where the dielectric material has been removed.

Block 825 pertains to utilizing a plating bath to deposit a conductive material upon the plating base. The conductive material covers all exposed surfaces of the circuit assembly 900, the exposed surfaces including the areas where the dielectric material has been removed. In one exemplary implementation, the plating bath is used for carrying out an electroplating procedure for depositing the conductive material upon the plating base.

In an exemplary implementation, the quantity of conductive material deposited upon the circuit assembly 900 can be controlled by using various techniques such as plating chemistry, plating current, and plating time in order to ensure that the conductive material has a desired thickness. A portion 950 of the top surface of the conductive material may have a topography that partially follows the underlying topography of the plating base.

A planarizing procedure may be optionally carried out upon an upper portion of the circuit assembly 900 after completion of the operations indicated in block 825. The planarization procedure, which is typically incorporated into what is known as a Damascene procedure of manufacture, involves removing a top portion of the conductive material. In one exemplary implementation, the portion 950 of the conductive material that is located above a planarizing axis 930 is removed. Upon completion of the planarization procedure, the circuit assembly 900 has a Damascene pattern in which some areas of the conductive material are inlaid among areas of the dielectric material.

In another optional procedure, a portion of the dielectric material in one or more of a first area 905, a second area 915, and a third area 925 is removed for reducing a thickness of the dielectric material in these one or more areas. In an exemplary implementation, a portion of the dielectric material located in the second area 915 is removed so as to leave a very thin layer of the dielectric material in a gap 916 between the conductive material covering the first component 605 and the conductive material covering the second component 615. In another exemplary implementation, all the dielectric material located in the second area 915 is removed so as to leave a top portion of the interposer 535 exposed in the gap 916 between the conductive material covering the first component 605 and the conductive material covering the second component 615.

Figure 10:
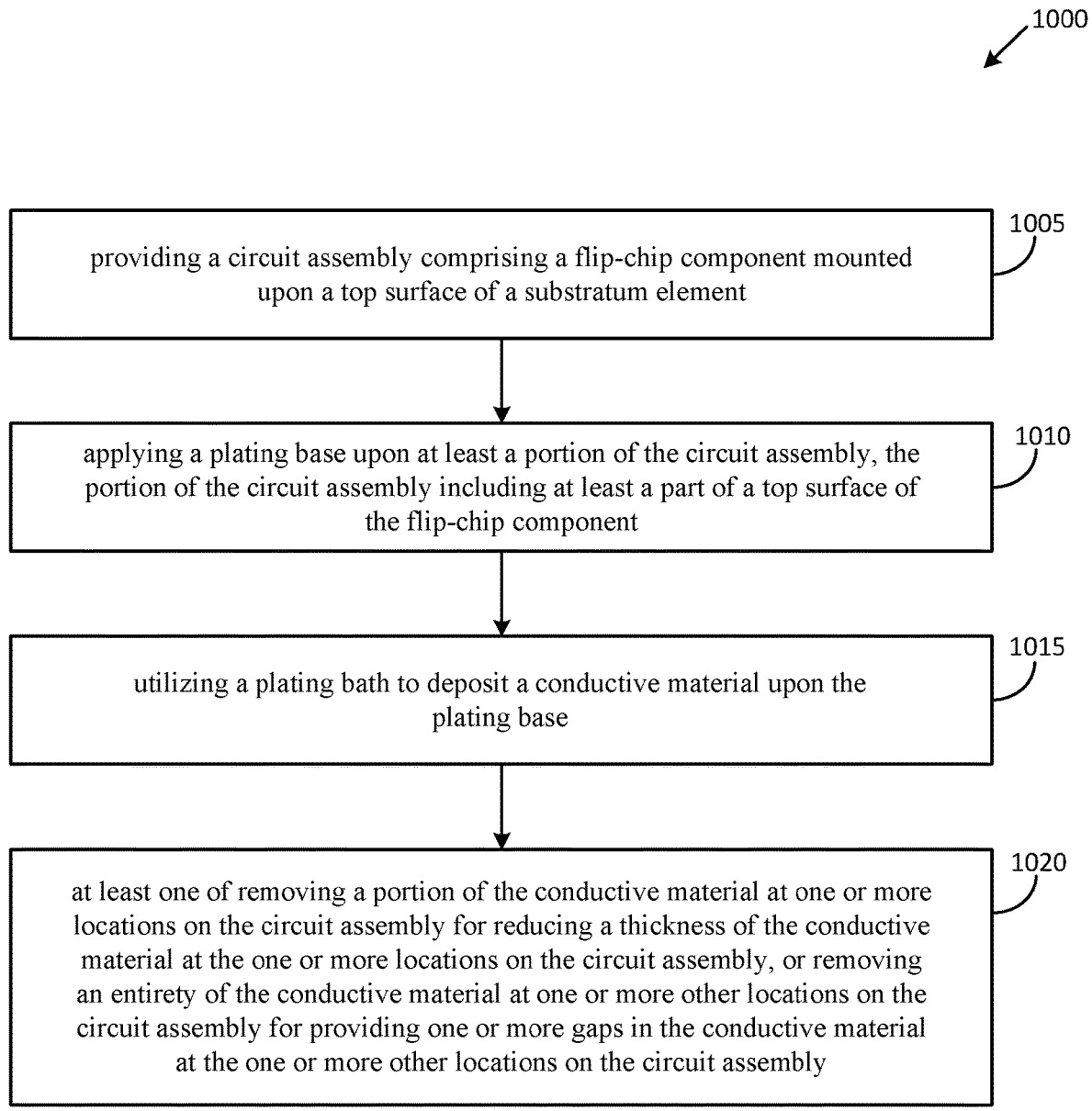
FIG. 10 shows a flowchart that illustrates a third exemplary method to fabricate a circuit assembly in accordance with an embodiment of the disclosure.

FIG. 10 shows a flowchart 1000 that illustrates a third exemplary method to fabricate a circuit assembly in accordance with an embodiment of the disclosure. Block 1005 pertains to providing a circuit assembly comprising a flip-chip component mounted upon a top surface of a substratum element. A few examples of such a circuit assembly include the circuit assembly 400, the circuit assembly 500, and the circuit assembly 600 described above. The circuit assembly 500 is used below as a non-limiting example to describe the operations following the operation described in block 1005.

Prior to proceeding with the operation indicated in block 1010, any gaps between a bottom surface of each of the flip-chip components and a top surface of the substratum element is underfilled and sealed by using one or more procedures such as a chemical vapor deposition (CVD) procedure, capillary underfill process (CUF), or a no-flow underfill process and a suitable sealant material.

Block 1010 pertains to applying a plating base upon at least a portion of the circuit assembly, the portion of the circuit assembly including at least a part of a top surface of the flip-chip component. For example, with respect to the circuit assembly 500, a plating base is applied upon the entire circuit assembly 500 including the top surface of the first component 405, the top surface of the second component 430, and the exposed top surface of the interposer 535. Application of the plating base can be carried out using various plating procedures such as a CVD procedure, an evaporation procedure, or a sputtering procedure. In one exemplary implementation, the plating base is applied in the form of multiple layers such as a first layer of a material having an adhesive property, a second layer of a material having a barrier property, and a third layer of a material having a seed property. One example of a material having an adhesive property is titanium. Examples of materials having a barrier property include tantalum and platinum. One example of a material having a seed property is copper.

Block 1015 pertains to utilizing a plating bath to deposit a conductive material upon the plating base. The conductive material covers the entire circuit assembly 500 when the plating base has been applied upon the entire circuit assembly 500. In one exemplary implementation, the plating bath is used for carrying out an electroplating procedure for depositing the conductive material upon the plating base. A predefined quantity of conductive material is deposited upon the plating base so as to provide a sheathing that has uniform thickness across the circuit assembly 500.

Block 1020 pertains to removing a portion of the conductive material at one or more locations on the circuit assembly for reducing a thickness of the conductive material at the one or more locations on the circuit assembly, and/or removing an entirety of the conductive material at one or more other locations on the circuit assembly for providing one or more gaps in the conductive material at the one or more other locations on the circuit assembly. Reducing the thickness of the conducting material is directed at providing material having a first thickness upon the top surface of the first component 405 (first section 415), a second thickness upon the top surface of the second component 430, and a third thickness upon the top surface of the interposer 535. The thicknesses can be selected to counteract and/or prevent deformation in the circuit assembly 500 as described above.

Removing an entirety of the conductive material at one or more other locations on the circuit assembly for providing one or more gaps in the conductive material at the one or more other locations on the circuit assembly is illustrated by the gap 635 in the circuit assembly 600 shown in FIG. 6. The conductive material may be left undisturbed in places other than the gap 635 such as all surfaces of the first component 605 and the second component 615.

In summary, the disclosure pertains to a conductive sheath that is operative as a heat sink and/or an EMI shield. The conductive sheath is fabricated using metal deposition and plating techniques as opposed to conventional stamped or machined lids/heatsinks. Many semiconductor substrates or circuit assembly substrates have low coefficients of thermal expansion (CTE). Metals typically have higher CTEs. When a conductive sheath having a first CTE is provided upon a substrate having a different CTE and the composite structure experiences a change in temperature, the two materials tend to expand or contract by differing amounts. When rigidly attached to each other, the materials are not free to expand or contract at their desired rates, which can lead to deformation of the structure. The deformation may be acceptable in some cases where the conductive sheath is very thin in comparison to the substrate. However, when the thickness of the conductive sheath is increased (such as for operating as an effective heat sink), the amount of deformation may be unacceptable. The various embodiments described herein offer some solutions that address such issues.

It should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A circuit assembly comprising:
   a first component mounted upon a top surface of a substratum element; and
   a conductive sheath comprising:
     a first section comprising a conductive material deposited upon at least a part of a top surface of the first component;
     a second section comprising the conductive material deposited upon at least one side surface of the first component, the second section connected to the first section; and
     a third section comprising the conductive material deposited upon at least a portion of the top surface of the substratum element, the third section connected to the second section, the third section comprising an edge portion where the conductive material in the third section has a transition from a first thickness to a second thickness that is smaller than the first thickness, the edge portion configured to undergo deformation to counteract warping of the circuit assembly due to heat generated in at least the first component.

2. The circuit assembly of claim 1, wherein the substratum element comprises at least one of a printed circuit board, a substrate, or an interposer fabricated upon a top surface of the substrate.

3. The circuit assembly of claim 1, wherein the deformation of the edge portion comprises a lateral displacement of at least a part of the edge portion.

4. The circuit assembly of claim 1, wherein the conductive material deposited upon the at least the part of the top surface of the first component has a third thickness that is selected for removing at least a portion of heat from the top surface of the first component.

5. The circuit assembly of claim 1, wherein at least the third section of the conductive sheath is connected to a ground node to configure the conductive sheath as an electromagnetic interference shield.

6. The circuit assembly of claim 1, wherein the substratum element comprises an interposer fabricated upon a top surface of a substrate, wherein the conductive material is a thermally conductive material, and wherein the first component has a first terminal attached to a first pad located upon a top surface of the interposer.

7. The circuit assembly of claim 6, further comprising:
a first metal conductor extending through the interposer from the third section of the conductive sheath to a bottom surface of the interposer for transferring at least a portion of heat from the third section of the conductive sheath to the substrate.

8. The circuit assembly of claim 1, wherein the first component is one of an integrated circuit, a semiconductor die, a microelectronic package, a flip-chip component, a passive component, or an active component.

9. A circuit assembly comprising:
a first component comprising a first terminal attached to a first pad located upon a top surface of a substratum element;
a first section of a conductive sheath, the first section comprising a conductive material deposited upon at least a part of a top surface of the first component and at least one side surface of the first component, the first section extending from the at least one side surface of the first component to a first location upon the top surface of the substratum element; and
a second section of the conductive sheath, the second section comprising the conductive material deposited upon at least a part of a top surface of the substratum element and extending to a second location upon the top surface of the substratum element, the second location located adjacent to, and isolated from, the first location by a gap that accommodates expansion of at least the first section of the conductive sheath due to heat generated in at least the first component.

10. The circuit assembly of claim 9, further comprising:
a second component having a second terminal attached to a second pad located upon the top surface of the substratum element, and wherein the second section of the conductive sheath comprises the conductive material deposited upon at least a part of a top surface of the second component and at least one side surface of the second component, the second section extending from the at least one side surface of the second component to the second location upon the top surface of the substratum element.

11. The circuit assembly of claim 10, wherein the first section of the conductive sheath has a first thickness and the second section of the conductive sheath has a second thickness that is equal to the first thickness.

12. The circuit assembly of claim 10, wherein the first section of the conductive sheath has a first thickness and at least a portion of the second section of the conductive sheath has a second thickness that is different than the first thickness.

13. The circuit assembly of claim 10, wherein:
wherein the substratum element comprises an interposer fabricated upon a top surface of a substrate, the interposer comprising at least one dielectric layer,
the first component is one of a first flip-chip integrated circuit, a first semiconductor die, a first microelectronic package, a first passive component, or a first active component, and
the second component is one of a second flip-chip integrated circuit, a second semiconductor die, a second microelectronic package, a second passive component, or a second active component.

* * * * *